(12) United States Patent
Kostamo et al.

(10) Patent No.: US 10,329,662 B2
(45) Date of Patent: Jun. 25, 2019

(54) PROTECTING AN INTERIOR OF A HOLLOW BODY WITH AN ALD COATING

(71) Applicant: Picosun Oy, Espoo (FI)

(72) Inventors: Juhana Kostamo, Espoo (FI); Timo Malinen, Espoo (FI); Väino Sammelselg, Tartu (EE); Jaan Aarik, Tartu (EE); Lauri Aarik, Tartu (EE)

(73) Assignee: PICOSUN OY, Espoo (FI)

( * ) Notice: Subject to any disclaimer, the term of this patent is extended or adjusted under 35 U.S.C. 154(b) by 0 days.

(21) Appl. No.: 15/123,019

(22) PCT Filed: Mar. 3, 2014

(86) PCT No.: PCT/FI2014/050153
§ 371 (c)(1),
(2) Date: Sep. 1, 2016

(87) PCT Pub. No.: WO2015/132444
PCT Pub. Date: Sep. 11, 2015

(65) Prior Publication Data
US 2017/0073807 A1    Mar. 16, 2017

(51) Int. Cl.
*C23C 16/04* (2006.01)
*C23C 16/44* (2006.01)
*C23C 16/455* (2006.01)

(52) U.S. Cl.
CPC ........ *C23C 16/045* (2013.01); *C23C 16/4412* (2013.01); *C23C 16/45544* (2013.01); *C23C 16/45555* (2013.01)

(58) Field of Classification Search
CPC ............ C23C 16/45544; C23C 16/045; C23C 16/4412; C23C 16/45555

USPC .......................... 117/884, 200; 427/230–239
See application file for complete search history.

(56) References Cited

U.S. PATENT DOCUMENTS

| | | | |
|---|---|---|---|
| 4,859,489 A | 8/1989 | Pinkhasov | |
| 5,741,544 A | 4/1998 | Mahulikar | |
| 5,849,366 A * | 12/1998 | Plester | B05D 1/62 427/489 |

(Continued)

FOREIGN PATENT DOCUMENTS

| CN | 102452797 A | 5/2012 |
|---|---|---|
| CN | 202753490 U | 2/2013 |

(Continued)

OTHER PUBLICATIONS

Suntola, Tuomo, "Atomic Layer Epitaxy," Materials Science Reports 4 (1989) 261-312. (Year: 1989).*

(Continued)

*Primary Examiner* — William P Fletcher, III
(74) *Attorney, Agent, or Firm* — Ziegler IP Law Group, LLC

(57) ABSTRACT

An apparatus and method for protecting an interior of a hollow body, where an inlet and exhaust manifold include a port assembly attachable to an opening of the hollow body is provided. The interior of the hollow body is exposed to sequential self-saturating surface reactions by sequential inlet of reactive gases via the port assembly and the opening into the interior of the hollow body, and excess gases is pumped via the opening and the port assembly out from the hollow body.

15 Claims, 5 Drawing Sheets

(56) References Cited

U.S. PATENT DOCUMENTS

| | | | |
|---|---|---|---|
| 6,416,577 | B1* | 7/2002 | Suntoloa .............. C23C 16/045 117/200 |
| 2006/0137608 | A1 | 6/2006 | Choi et al. |
| 2006/0150909 | A1* | 7/2006 | Behle ...................... B08B 7/00 118/719 |
| 2007/0269595 | A1 | 11/2007 | Harkonen et al. |
| 2009/0194233 | A1 | 8/2009 | Tamura et al. |
| 2009/0263578 | A1* | 10/2009 | Lindfors ............ C23C 16/4485 427/248.1 |
| 2011/0129618 | A1 | 6/2011 | Matsunaga et al. |

FOREIGN PATENT DOCUMENTS

| | | | |
|---|---|---|---|
| JP | H02-185980 | A | 7/1990 |
| JP | H08509166 | A | 10/1996 |
| JP | 2001-220287 | A | 8/2001 |
| JP | 2002053119 | A | 2/2002 |
| JP | 2004-297577 | A | 10/2004 |
| JP | 2006160269 | A | 6/2006 |
| JP | 2006321528 | A * | 11/2006 |
| JP | 2007-5545 | A | 1/2007 |
| JP | 2007-224348 | A | 9/2007 |
| JP | 2008261060 | A * | 10/2008 |
| JP | 2009-529605 | A | 8/2009 |
| JP | 2011-513593 | A | 4/2011 |
| JP | 2011-135046 | A | 7/2011 |
| JP | 2011-523444 | A | 8/2011 |
| JP | 2012-172208 | A | 9/2012 |
| JP | 2012-526921 | A | 11/2012 |
| JP | 2013-502599 | A | 1/2013 |
| JP | 2013-211551 | A | 10/2013 |
| WO | 9522413 | | 8/1995 |
| WO | 2007/062264 | A2 | 5/2007 |
| WO | 2009/112053 | A1 | 9/2009 |
| WO | 2010/132579 | A2 | 11/2010 |

OTHER PUBLICATIONS

International Search Report and Written Opinion, Application No. PCT/FI2014/050153, dated Oct. 24, 2014, 16 pages.
Extended European Search Report, Application No. 14884857.5-1373/3114249 PCT/FI2014/050153, dated Feb. 23, 2017, 9 pages.
International Preliminary Report on Patentability and Written Opinion received for International Patent Application No. PCT/FI2014/050152, dated Sep. 6, 2016, 10 pages.
International Preliminary Report on Patentability and Written Opinion received for International Patent Application No. PCT/FI2014/050153, dated Sep. 6, 2016, 10 pages.
International Search Report and Written Opinion received for International Patent Application No. PCT/FI2014/050152, dated Oct. 28, 2014, 16 pages.
Office Action received for Japanese Patent Application No. JP2016-549485, dated Dec. 20, 2017, 7 pages including 3 pages of English translation.
Japanese Patent Office; Decision to Grant a Patent; Patent Application No.: 2016-549485; dated Jun. 15, 2018.
First Office Action received for Chinese Patent Application No. 201480076746.9, dated Mar. 20, 2018, 08 pages including 02 pages of English translation.
First Office Action received for Chinese Patent Application No. 201480076747.3, dated Mar. 20, 2018, 08 pages including 02 pages of English translation.
Extended European Search Report received for European Patent Application No. EP14885016.7, dated Feb. 23, 2017, 09 pages.
Office Action issued for Japanese Patent Application No. JP2018-036128, dated Nov. 26, 2018, 8 pages including 4 pages of English translation.
International Search Report received for International Patent Application No. PCT/FI2014/050153, dated Oct. 28, 2014, 07 pages.
Second Office Action received for Chinese Patent Application No. CN2014800767469, dated Jan. 03, 2019, 08 pages including 2 pages of English translation.

* cited by examiner

PROTECTING AN INTERIOR OF A HOLLOW BODY WITH AN ALD COATING

FIELD

The aspects of the disclosed embodiments generally relate to atomic layer deposition (ALD). More particularly, the aspects of the disclosed embodiments relate to providing protective coating by means of ALD.

BACKGROUND

This section illustrates useful background information without admission of any technique described herein representative of the state of the art.

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water resulting in only about 1% non-uniformity over a substrate wafer.

One interesting application of ALD technique is providing protective coatings on surfaces.

SUMMARY

According to a first example aspect of the disclosed embodiments there is provided a method of protecting an interior of a hollow body, the method comprising:
providing an inlet and exhaust manifold comprising a port assembly attachable to an opening of the hollow body;
exposing the interior of the hollow body to sequential self-saturating surface reactions by sequential inlet of reactive gases via said port assembly and said opening into the interior of the hollow body; and
removing excess gases via said opening and said port assembly out from the hollow body.

The hollow body in this patent application may be any hollow body whose inner walls require a protective coating other than a gas container. Examples of applicable hollow bodies comprise ovens, crushers, vibrators, valves, heat exchangers, fuel cells, liquid and mixing containers. Further examples include various closed processing equipment in which both inlet and outlet occurs via a same port.

The sequential self-saturating surface reactions (according to ALD) produce the desired protective coating within the interior (on the inner surfaces) of the hollow body. Accordingly, the interior of the hollow body may be coated by using ALD so that all surfaces within the hollow body which see the reactive gases end up coated.

In the event the hollow body (or equipment) comprises another opening than the one mentioned leading to the interior of the hollow body, certain example embodiments comprise covering this another opening by a suitable cover or otherwise closing it.

In certain example embodiments, the method comprises attaching said port assembly to said opening of the hollow body. Said opening of the hollow body may be a hollow body mouth. The hollow body opening may be threaded.

In certain example embodiments, when both the inlet side and the exhaust side of the manifold operate via the same port assembly (which in turn operates via the one and the same opening of the hollow body), the port assembly can be defined as an integrated port assembly.

In certain example embodiments, the method comprises pumping excess gases, such as reaction residue and purge gas, from the interior of the hollow body by a vacuum pump attached to an exhaust side of the inlet and exhaust manifold. The vacuum pump may provide one or more of the following effects: It may be used to pump the interior of the hollow body into vacuum. It may be configured to pump excess gases from the hollow body via the port assembly.

The hollow body may be used as the reaction chamber for ALD reactions. Accordingly, in certain example embodiments, the hollow body is used as a reaction vessel sealed by the port assembly. The sequential self-saturating surface reactions are thereby limited to occur within the interior of the hollow body.

In certain example embodiments, the hollow body whose inner walls are coated forms a hot wall reaction chamber heated by an external heater.

In certain example embodiments, both gas inlet and gas exhaust occurs via a same opening (or port) of the hollow body. In certain example embodiments, the inlet and exhaust manifold hermetically connected to the hollow body opens directly into the hollow body and allows alternate supply of the precursors needed for performing an ALD process, purging the inner volume of the hollow body with an inert gas and evacuation of the precursors, gaseous reaction products and purge gas from the hollow body.

In certain example embodiments, the hollow body is closable (or closed) by the inlet and exhaust manifold.

In certain example embodiments, said port assembly comprises a sealing part. In certain example embodiments, the sealing part is detachably attachable to the hollow body opening in the place of a hollow body stop valve (if any). The sealing part, in certain example embodiments, comprises a tapered thread. In certain example embodiments, the tapered thread is configured to fit to a counter thread in the hollow body opening. The sealing part may be twisted into the hollow body opening to seal the hollow body opening. In certain example embodiments, there is a sealing tape, such as Teflon tape between the tapered thread and the threaded hollow body opening to improve sealing. In certain example embodiments, at least one in-feed line and an exhaust line pass through the sealing part. In certain example embodiments, said port assembly comprises a fitting part detachably attachable to the sealing part. The fitting part may form a (cylindrical) continuation of the sealing part. In certain example embodiments, when the fitting part is detached from the sealing part, the sealing part is twistable to tighten against the hollow body opening. Depending on the implementation, the fitting part may allow the sealing part to twist also when attached to the fitting part. In certain example embodiments, at least one in-feed line and an exhaust line pass both through the sealing part and the fitting part. In certain example embodiments, an interface between the sealing part and the fitting part is airtight when the fitting part has been attached to the sealing part. In certain example embodiments, there is an airtight feedthrough at an opposite end of the fitting part for at least one of an in-feed and an exhaust line to pass through.

In embodiments, in which the hollow body is placed into a chamber of a reactor for deposition, such as a reaction or vacuum chamber, the sealing by the port assembly prevents a coating from being deposited onto the chamber walls. This reduces the need to clean the chamber walls.

In certain example embodiments, the hollow body is used as a reaction vessel sealed by a sealing part comprised by the port assembly.

In certain example embodiments, said sealing part comprises a tapered thread detachably attachable to said opening of the hollow body in the place of a stop valve.

In certain example embodiments, said port assembly comprises a fitting part attachable to the sealing part allowing the sealing part to twist to tighten against said opening of the hollow body.

In certain example embodiments, the method comprises:
guiding inactive purge gas into an intermediate space between the hollow body and a surrounding chamber wall, and
pumping said inactive purge gas out from the intermediate space.

An over pressure generated by guiding the inactive purge gas into the intermediate space further improves the sealing effect of the port assembly. The intermediate space in an embodiment is kept in a vacuum pressure by a vacuum pump which is in fluid communication with the intermediate space. By arranging a material flow from the intermediate space through an exhaust conduit to a pump, such as the vacuum pump, any precursor material ended up into the intermediate space can be removed.

The inlet and exhaust manifold provides at least one in-feed line and an exhaust line. Precursor vapor is discharged from said at least one in-feed line at a discharge point within the hollow body. The exhaust line begins at an exhaust point within the hollow body. In certain example embodiments, the discharge point (i.e., a gas discharge point) within the hollow body is arranged at a different level than the exhaust point (i.e., a gas exhaust point). In certain example embodiments, the discharge point is arranged, within the interior of the hollow body, at an end of the hollow body opposite to an end of the hollow body in which the exhaust point resides. In certain example embodiments, a gas line (exhaust or in-feed line) which extends to the farthest end travels all the way from the opening to the farthest end within the hollow body.

The discharge point in certain example embodiments resides at an end of the hollow body opposite to the end in which the opening resides and the exhaust point resides at the opposite end (i.e., at the end in which the opening resides). The discharge point in certain example embodiments resides at an end of the hollow body in which the opening resides and the exhaust point resides at the opposite end (i.e., at the end opposite to the end in which the opening resides). In certain example embodiments in which the hollow body has a top and a bottom, the discharge point resides at the bottom (or bottom section) of the hollow body the exhaust point being in the top (or top section). In certain example embodiments in which the hollow body has a top and a bottom, the discharge point resides in the top (or top section) of the interior of the hollow body the exhaust point being at the bottom (or bottom section).

In certain example embodiments, the inlet and exhaust manifold comprises one or more in-feed lines with their controlling elements controlled by a computer-implemented control system.

In certain example embodiments, the inlet and exhaust manifold comprises ALD reactor in-feed equipment. In certain example embodiments, the in-feed equipment comprises in-feed line(s) and at least the desired precursor and inactive gas flow controlling elements, such as valve(s), mass flow controller(s) or similar, and their control system.

The control system may be implemented for example by software in a laptop computer or similar. Accordingly, in certain example embodiments, the inlet and exhaust manifold comprises one or more in-feed lines with their controlling elements controlled by a computer-implemented control system. Suitable replaceable precursor and inactive gas sources may be attached to the in-feed equipment.

According to a second example aspect of the disclosed embodiments there is provided an apparatus for protecting an interior of a hollow body, comprising:
an inlet and exhaust manifold comprising a port assembly attachable to an opening of the hollow body, the apparatus being configured to expose the interior of the hollow body to sequential self-saturating surface reactions by sequential inlet of reactive gases via said port assembly and said opening into the interior of the hollow body; and
a pump configured to remove excess gases via said opening and said port assembly out from the hollow body.

In certain example embodiments, a gas discharge point provided by the inlet and exhaust manifold is arranged at a different level than a gas exhaust point provided by the inlet and exhaust manifold. The different levels here typically mean different heights.

In certain example embodiments, the inlet and exhaust manifold comprises precursor vapor and purge gas in-feed lines and their controlling elements. The pump may attached to the exhaust side of the inlet and exhaust manifold. The pump may be a vacuum pump.

In certain example embodiments, the inlet and exhaust manifold comprises a hollow body-specific port assembly configured to attach the inlet and exhaust manifold into said opening of the hollow body thereby forming a fluid communication path between the inlet and exhaust manifold and the interior of the hollow body. Similarly, a fluid communication path between the interior of the hollow body and the pump is formed.

In certain example embodiments, the port assembly comprises a sealing part attachable to the opening of the hollow body.

In certain example embodiments, the sealing part comprises a tapered thread.

In certain example embodiments, the apparatus comprises:
a chamber surrounding the hollow body and an inactive gas in-feed line configured to guide inactive purge gas into an intermediate space between the hollow body and a surrounding chamber wall.

The apparatus comprising the inlet and exhaust manifold may be mobile so that it can be moved to meet the user's needs. In certain example embodiments, the inlet and exhaust manifold comprises a separate inlet manifold and a separate exhaust manifold both being able to simultaneously couple to the opening of the hollow body and designed to work together in a hollow body interior protecting method.

In a further aspect, instead of arranging the inlet and exhaust of gases via the same opening, the inlet of gases can be arranged via a first opening of a follow body and exhaust of gases via another opening of the hollow body, if applicable.

Different non-binding example aspects and embodiments of the present disclosed embodiments have been illustrated in the foregoing. The above embodiments are used merely to explain selected aspects or steps that may be utilized in implementations of the present disclosed embodiments. Some embodiments may be presented only with reference to certain example aspects of the disclosed embodiments. It should be appreciated that corresponding embodiments may apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. The at least one substrate is exposed to temporally separated precursor pulses in a reaction vessel to deposit material on the substrate surfaces by sequential self-saturating surface reactions. In the context of this application, the at least one substrate comprises the interior (inner surfaces) of a hollow body. Further, in the context of this application, the term ALD comprises all applicable ALD based techniques and any equivalent or closely related technologies, such as, for example MLD (Molecular Layer Deposition) technique.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

In certain example embodiments as described in the following, there is provided a method and apparatus for protecting a hollow body interior with a protective coating. The hollow body here is a pressure vessel. The hollow body itself forms a reaction chamber (or a reaction space), and there is typically no separate substrate, but the surfaces of the interior of the hollow body form a substrate (substrate here meaning the material on which a process is conducted). All these surfaces can be coated by an ALD process in which precursor vapors are sequentially inlet via an inlet and exhaust manifold into the interior of the hollow body. Excess gases, such as reaction residue (if any) and purge gas, is pumped out from the interior of the hollow body via an exhaust side of the inlet and exhaust manifold. The hollow body can be optionally heated before and/or during ALD processing by a heater placed around the hollow body.

Figure 1:
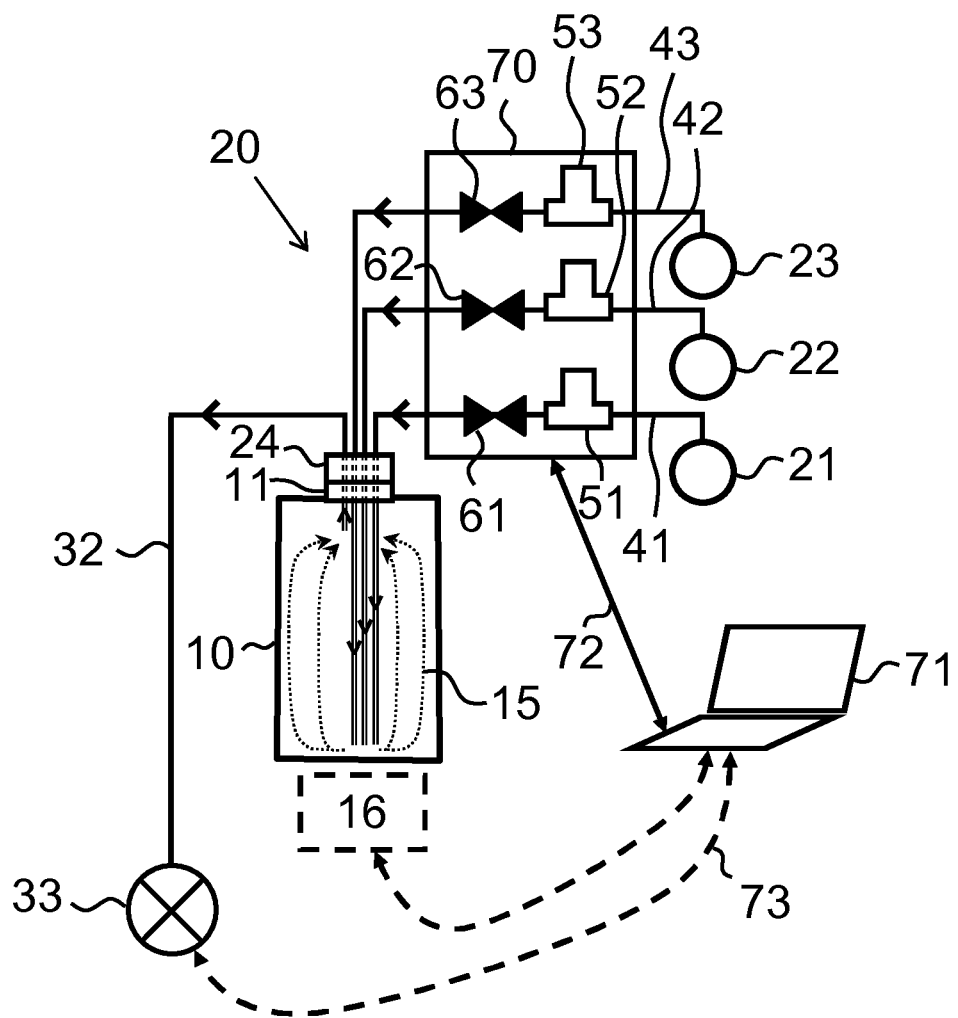
FIG. 1 shows a schematic view of an apparatus and its use for protecting an interior of a hollow body in accordance with an example embodiment.

FIG. 1 shows the method and related apparatus in certain example embodiments. The apparatus used to protect the interior of a hollow body 10 comprises an inlet and exhaust manifold 20. The apparatus may be a mobile apparatus. A mobile apparatus may be conveniently moved into the proximity of hollow bodies to be protected, if needed.

The inlet and exhaust manifold 20 is configured to be detachably attached to an opening 11 of the hollow body. FIG. 1 shows the inlet and exhaust manifold 20 attached by a port assembly 24 to the hollow body opening 11. The port assembly 24 may be a hollow body-specific part. The port assembly comprises a sealing arrangement (not shown) to seal the interface between the hollow body opening 11 and the port assembly 24. In an example implementation, the port assembly comprises a seal (not shown) which tightens against its counter surface in the hollow body opening 11.

The inlet and exhaust manifold 20 comprises ALD reactor in-feed equipment 70. The in-feed equipment 70 comprises the required in-feed lines and their controlling elements. Attached to the port assembly 24 in FIG. 1 is a first precursor vapor in-feed line 41, a second precursor in-feed line 42 and a purge gas in-feed line 43. The first precursor in-feed line 41 originates from a first precursor source 21, the second precursor in-feed line 42 from a second precursor source 22, and the purge gas in-feed line 43 from a purge/inactive gas source 23. The in-feed lines 41-43 extend, travelling through the port assembly 24 and hollow body opening 11, from the sources 21-23 to the interior of the hollow body 10. The in-feed lines 41-43 end at respective discharge points. An exhaust line 32 begins at an exhaust point within the interior of the hollow body. The discharge points should reside in a different level than the exhaust point to effectively obtain uniform deposition. In the embodiment shown in FIG. 1 the discharge points of the in-feed lines 41-43 are at the bottom section of the hollow body 10 the exhaust point being in the top section.

The in-feed line controlling elements comprise flow and timing controlling elements. A first precursor in-feed valve 61 and mass (or volume) flow controller 51 in the first precursor in-feed line 41 control the timing and flow of first precursor pulses. Correspondingly, a second precursor in-feed valve 62 and mass (or volume) flow controller 52 in the second precursor in-feed line 42 control the timing and flow of second precursor pulses. Finally, a purge gas in-feed valve 63 and mass (or volume) flow controller 53 control the timing and flow of purge gas.

In the embodiment shown in FIG. 1, the operation of the in-feed equipment 70 is controlled by a control system. FIG. 1 shows a control connection 72 between the in-feed equipment 70 and a control system 71. The control system 71 may be implemented for example by software in a laptop computer or similar.

In certain example embodiments, the ALD process within the interior of the hollow body is performed in a vacuum pressure. The inlet and exhaust manifold 20 comprises a vacuum pump 33. In certain example embodiments, the vacuum pump 33 is located in the end of the exhaust line 32 provided by the inlet and exhaust manifold 20. The vacuum pump 33 can be optionally controlled by the control system 71 via an optional electrical connection 73 (which is between the control system 71 and the vacuum pump 33). In certain example embodiments, the hollow body is heated by an external heater (not shown).

In operation, the vacuum pump 33 pumps the interior of the hollow body 10 into vacuum. Precursor vapor of the first precursor and second precursor are sequentially discharged into the interior of the hollow body from the discharge points of the first and second precursor in-feed lines 41 and 42, respectively. In the purge steps, inactive purging gas is discharged into the interior of the hollow body from the discharge point of the purge gas in-feed line 43. The arrows 15 depict the flow direction of precursor vapor and purge gas within the hollow body from the respective discharge points towards the exhaust point (via which they are pumped into the exhaust line 32). The desired thickness of protective coating onto the hollow body inner surface is obtained by repeating deposition cycles as needed.

Further referring to FIG. 1, it should be noted that in other embodiments, the inlet and exhaust manifold 20 may be arranged differently. Instead of separate in-feed lines at least part of the in-feed lines may be in common. The valve types may vary. The flow controlling element locations may vary, etc. For example, three-way valves may be used instead of two-way valves, immediately reflecting changes in in-feed line routing. Concerning the precursor sources and purge gas, their selection depends on the implementation and desired coating. The hollow body 10 can be heated by an optional heater 16 from the outside of the hollow body 10. The heater may be a helical coil heater arranged around the hollow body 10. The operation of the heater can be optionally controlled be the control system 71 over a connection.

Applicable coatings depending on the application are, for example, metal oxides, such as aluminum oxide, titanium oxide, tantalum oxide, and tungsten carbide, and their combinations, but the coatings are not limited to these materials.

In the event the hollow body comprises another opening than the one mentioned leading to the interior of the hollow body, said another opening in certain example embodiments is covered by a cover or is otherwise closed.

Figure 2A:
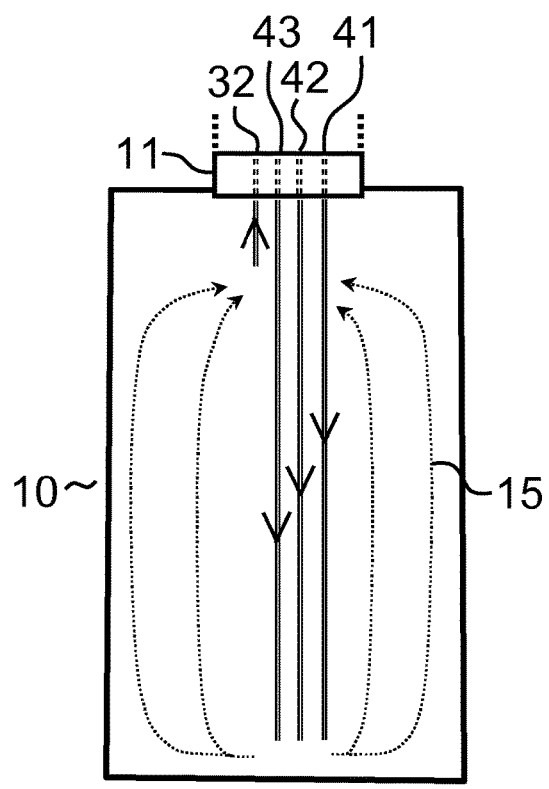
FIGS. 2A-2B show alternative in-feed arrangements in accordance with certain example embodiments.
Figure 2B:
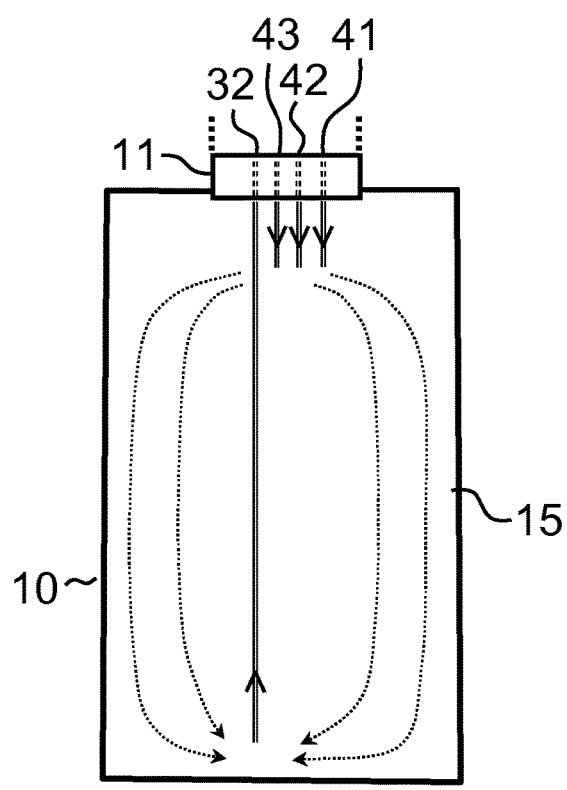

FIGS. 2A and 2B show two alternative embodiments for the placement of in-feed and exhaust lines within the hollow body 10. The hollow body 10 has an inner wall shape allowing free movement of low-pressure gases.

FIG. 2A corresponds to the arrangement shown in FIG. 1. Accordingly, the in-feed lines 41-43 and exhaust line 32 travel through the hollow body opening 11. The in-feed lines 41-43 end at respective discharge points. The exhaust line 32 begins at an exhaust point. The discharge points of the in-feed lines 41-43 are at the bottom section of the hollow body 10 the exhaust point being in the top section. The direction of gas flow is shown by the arrows 15.

In the preferred embodiment shown in FIG. 2B, the exhaust line to the contrary begins at the bottom section of the hollow body 10 whereas the discharge points of the in-feed lines 41-43 are in the top section. The in-feed lines 41-43 and exhaust line 32 travel through the hollow body opening 11. The in-feed lines 41-43 end at respective discharge points. The exhaust line 32 begins at an exhaust point. The direction of gas flow is shown by the arrows 15.

Figure 3:
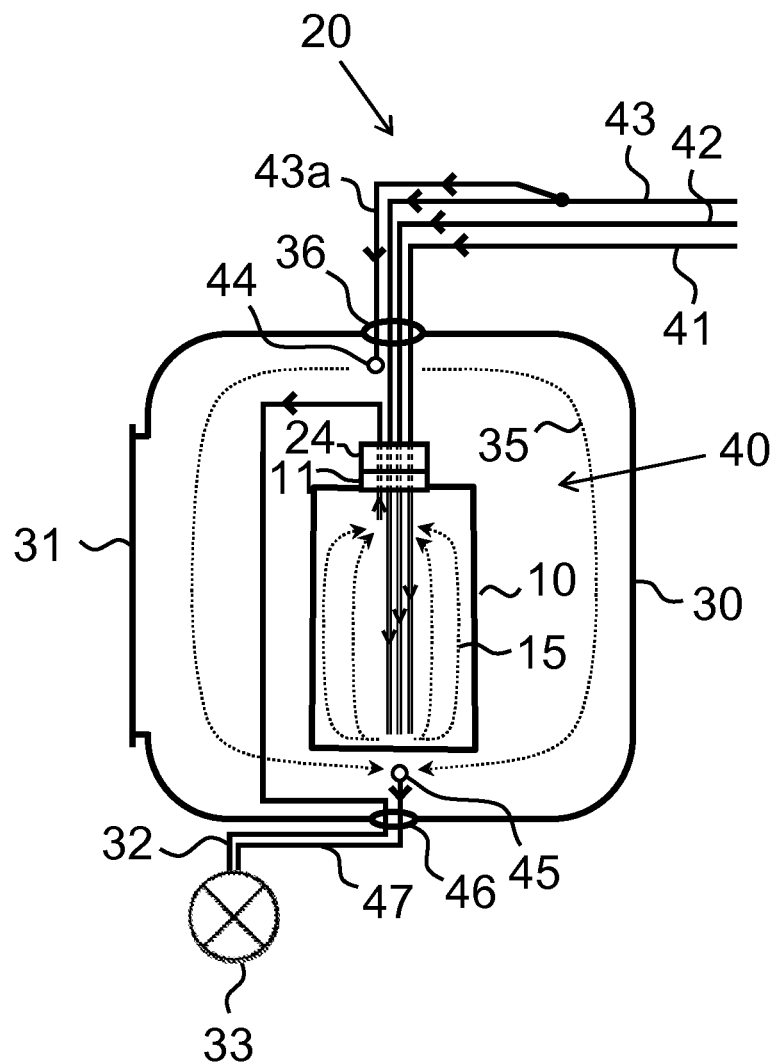
FIG. 3 shows another example embodiment.

FIG. 3 shows a method and apparatus for protecting an interior of a hollow body in accordance with another example embodiment. This embodiment basically corresponds to the embodiment shown in FIG. 1, however, disclosing certain further features.

FIG. 3 shows pressure vessel, such as a chamber 30 surrounding the hollow body 10. The chamber 30 may be, for example, a vacuum chamber or ALD reaction chamber generally used in the field of ALD. The hollow body 10 is loaded into the chamber 30 via a loading hatch 31, or similar, and is attached by its opening 11 to the port assembly 24. The in-feed lines 41-43 are passed into the chamber 30 through a feedthrough 36 arranged into the chamber 30 wall.

The exhaust line 32 is passed out from the chamber 30 through a feedthrough 46 arranged into the chamber 30 wall. The location of the feedthroughs 36 and 46 depend on the implementation. The feedthroughs 36 and 46 may even be implemented by a single feedthrough. The feedthroughs 36 and 46 are sealed.

The basic operation concerning the deposition of a protective coating within the hollow body 10 is similar to that described in connection with FIG. 1.

The embodiment shown in FIG. 3 optionally comprises a purge gas in-feed conduit 44 through which inactive purge gas is guided (discharged) into an intermediate space 40 between the hollow body 10 and a surrounding chamber 30 wall. The purge gas flows to the conduit 44, for example, along a branch 43a divided from the purge gas in-feed line 43.

The intermediate space 40 is pumped by the vacuum pump 33 via an exhaust conduit 45 arranged on the opposite side of the intermediate space 40. The exhaust pump 33 is in fluid communication with the intermediate space 40 through an exhaust line 47 extending from the exhaust conduit 45 to the exhaust pump 33. The exhaust lines 32 and 47 may join at some point on the way to the exhaust pump 33.

The pumping causes a flow within the intermediate space 40 that conducts any precursor material ended up into the intermediate space 40 into the exhaust line 47. An over pressure generated by guiding the inactive purge gas into the intermediate space 40 further improves the sealing effect of the port assembly 24. The arrows 35 depict the flow direction within the intermediate space 40.

Figure 4A:
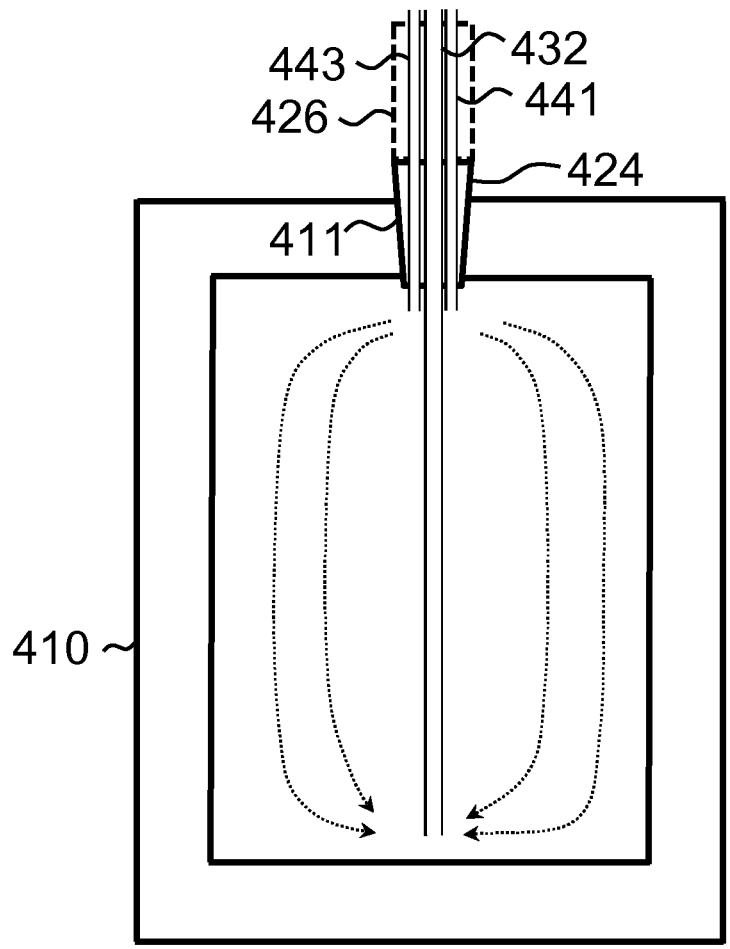
FIGS. 4A-4B show a sealing arrangement in accordance with certain example embodiments.

FIG. 4A shows a sealing arrangement in accordance with an example embodiment. The hollow body 410 comprises an opening 411 which can be, for example, a mouth of the hollow body. An inlet and exhaust manifold comprises a port assembly comprising a sealing part 424. The sealing part is detachably attachable, by for example twisting, to the opening 411 of the hollow body. If applicable, the sealing part is detachably attachable in the place of a hollow body stop valve or similar. For attaching and detaching, the sealing part 424 in this embodiment is a tapered thread part. The tapered thread of the sealing part is configured to fit to a counter thread (if any, not shown) in the hollow body opening 411 to tighten and seal the hollow body opening 411. As mentioned, the sealing part 424 can be, for example, twisted into the hollow body opening 411 to seal the hollow body opening.

Figure 4B:
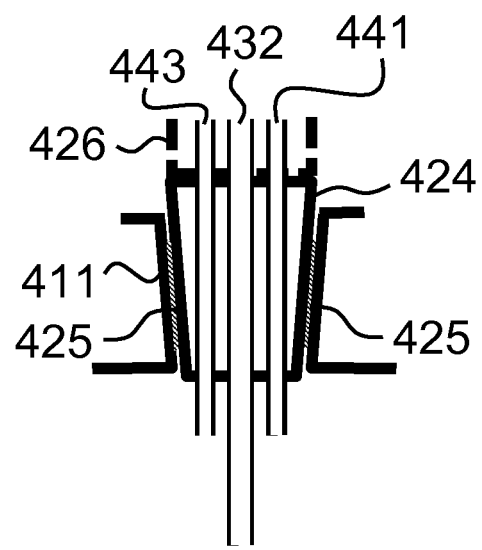

In certain example embodiments, there is sealing tape 425, such as Teflon tape around the tapered thread between the tapered thread and the threaded hollow body opening 411 to improve sealing as illustrated in FIG. 4B which is an enlargement of certain parts of FIG. 4A.

Depending on the implementation, the sealing part may be of a tapered form or not, and it may be threaded or not. Accordingly, in other embodiments, the sealing part may be, for example, a tapered part without a thread or a threaded part without tapering.

FIGS. 4A and 4B show two in-feed lines 441 and 443 as well as an exhaust line 432 arranged similarly as in the preferred FIG. 2B. Accordingly, the gas discharge point is in the very proximity of the hollow body opening and the exhaust point at the opposite end of the hollow body. The in-feed lines and exhaust line pass through the sealing part 424 extending through the sealing part into an interior of the hollow body 410. In certain example embodiments, the port assembly further comprises a fitting part 426 detachably attachable to the sealing part. The fitting part 426 forms a (cylindrical) continuation of the sealing part 424. In certain example embodiments, when the fitting part 426 is detached from the sealing part 424, the sealing part 424 is twistable to tighten against the hollow body opening 411. Depending on the implementation, the fitting part 426 may allow the sealing part 424 to twist also when attached to the fitting part 426. The in-feed lines 441 and 443 as well as the exhaust line 432 pass both through the sealing part 424 and the fitting part 426. The interface between the sealing part 424 and the fitting part 426 is airtight when the fitting part 426 has been attached to the sealing part 424. In certain example embodiments, there is an airtight feedthrough at an end opposite to the sealing part end of the fitting part 426 (as depicted in the upper section of FIG. 4A) for at least one of an in-feed line 441,443 and an exhaust line 432 to pass through. An airtight feedthrough here means basically a feedthrough at which gas can flow between the inside of a part and the outside of a part 426 only through a pipeline. An airtight interface, similarly, means an interface at which gas can flow from the part (for example, fitting part 426) on a first side of the interface to the part (for example, sealing part 424) on the other side only through the interface.

In embodiments, in which the fitting part is omitted, the feedthrough(s) are preferably arranged in the (upper) end of the sealing part 424.

As to the general operation of the embodiments shown in FIGS. 4A and 4B, a reference is made also to the embodiments shown in FIGS. 1 to 3.

Figure 5:
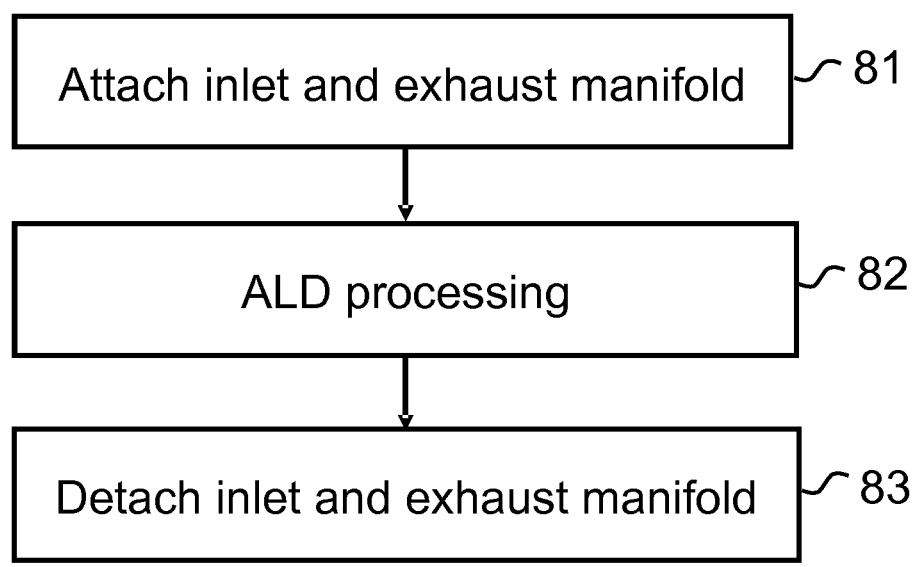
FIG. 5 shows a method in accordance with an example embodiment.

FIG. 5 shows a method in accordance with an example embodiment. In step 81, an inlet and exhaust manifold is attached to a hollow body. ALD processing is performed in step 82. The ALD processing comprises exposing the interior of the hollow body to sequential self-saturating surface reactions and removing excess gases out from the hollow body. Finally, in step 83, the inlet and exhaust manifold is detached from the hollow body.

Without limiting the scope and interpretation of the patent claims, certain technical effects of one or more of the example embodiments disclosed herein are listed in the following: A technical effect is protecting a hollow body interior by a conformal protective coating. Another technical effect is coating only the inside of the hollow body the outside being not coated. Another technical effect is reduced cleaning need of a surrounding chamber.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the a full and informative description of the best mode presently contemplated by the inventors for carrying out the aspects of the disclosed embodiments. It is however clear to a person skilled in the art that the aspects of the disclosed embodiments are not restricted to details of the exemplary embodiments presented above, but that it can be implemented in other embodiments using equivalent means without deviating from the characteristics of the disclosed embodiments.

Furthermore, some of the features of the above-disclosed embodiments of this disclosure may be used to advantage without the corresponding use of other features. As such, the foregoing description should be considered as merely illustrative of the principles of the aspects of the disclosed embodiments, and not in limitation thereof. Hence, the scope of the aspects of the disclosed embodiments is only restricted by the appended patent claims.

The invention claimed is:

1. A method of protecting an interior of a hollow body, the method comprising:
    providing an inlet and exhaust manifold comprising a port assembly attachable to an opening of the hollow body;
    exposing the interior of the hollow body to sequential self-saturating surface reactions by sequential inlet of reactive gases via said port assembly and said opening into the interior of the hollow body;
    removing excess gases via said opening and said port assembly out from the hollow body;
    guiding inactive purge gas into an intermediate space between the hollow body and a surrounding chamber wall; and
    pumping said inactive purge gas out from the intermediate space.

2. The method of claim 1, comprising attaching said port assembly to said opening of the hollow body.

3. The method of claim 1, comprising pumping reaction residue and purge gas from the interior of the hollow body by a vacuum pump attached to an exhaust side of the inlet and exhaust manifold.

4. The method of claim 1, wherein a gas discharge point within the hollow body is arranged at a different level than a gas exhaust point.

5. The method of claim 1, wherein the hollow body is used as a reaction vessel sealed by a sealing part comprised by the port assembly.

6. The method of claim 5, wherein said sealing part comprises a tapered thread detachably attachable to said opening of the hollow body.

7. The method of claim 5, wherein said port assembly comprises a fitting part attachable to the sealing part allowing the sealing part to twist to tighten against said opening of the hollow body.

8. The method of claim 1, wherein the inlet and exhaust manifold comprises one or more in-feed lines with their controlling elements controlled by a computer-implemented control system.

9. An apparatus for protecting an interior of a hollow body, comprising:
    an inlet and exhaust manifold comprising a port assembly attachable to an opening of the hollow body, the apparatus being configured to expose the interior of the hollow body to sequential self-saturating surface reactions by sequential inlet of reactive gases via said port assembly and said opening into the interior of the hollow body;
    a pump configured to remove excess gases via said opening and said port assembly out from the hollow body; and
    a chamber surrounding the hollow body and an inactive gas in-feed line configured to guide inactive purge gas into an intermediate space between the hollow body and a surrounding chamber wall.

10. The apparatus of claim 9, wherein a gas discharge point provided by the inlet and exhaust manifold is arranged at a different level than a gas exhaust point provided by the inlet and exhaust manifold.

11. The apparatus of claim 9, wherein the inlet and exhaust manifold comprises precursor vapor and purge gas in-feed lines and their controlling elements.

12. The apparatus of claim 9, wherein the inlet and exhaust manifold comprises a hollow body-specific port assembly configured to attach the inlet and exhaust manifold into said opening of the hollow body thereby forming a fluid communication path between the inlet and exhaust manifold and the interior of the hollow body.

13. The apparatus of claim 9, wherein the port assembly comprises a sealing part attachable to the opening of the hollow body.

14. The apparatus of claim 13, wherein the sealing part comprises a tapered thread.

15. The apparatus of claim 9, wherein the apparatus is mobile.

* * * * *